United States Patent [19]

Lo et al.

[11] Patent Number: 4,922,451

[45] Date of Patent: May 1, 1990

[54] MEMORY RE-MAPPING IN A MICROCOMPUTER SYSTEM

[75] Inventors: Yuan-Chang Lo, San Jose, Calif.; Dennis L. Moeller, Delray Beach; John J. Szarek, Boca Raton, both of Fla.

[73] Assignee: International Business Machines Corporation, Armonk, N.Y.

[21] Appl. No.: 391,634

[22] Filed: Aug. 7, 1989

Related U.S. Application Data

[63] Continuation of Ser. No. 29,013, Mar. 23, 1987, abandoned.

[51] Int. Cl.$^5$ ............................................. G06F 11/00
[52] U.S. Cl. .................................. 364/900; 364/943.9
[58] Field of Search ... 364/200 MS File, 900 MS File

[56] References Cited

U.S. PATENT DOCUMENTS

| | | | |
|---|---|---|---|
| 3,436,734 | 4/1969 | Pomerene et al. | 340/172.5 |
| 3,633,175 | 1/1972 | Harper | 340/172.5 |
| 3,659,275 | 4/1972 | Marshall | 340/173 R |
| 3,714,637 | 1/1973 | Beausoleil | 340/173 R |
| 3,735,368 | 5/1973 | Beausoleil | 340/173 R |
| 3,753,235 | 8/1973 | Daughton et al. | 340/172.5 |
| 3,753,244 | 8/1973 | Sumilas et al. | 340/172.5 |
| 3,755,791 | 8/1973 | Arzubi | 340/173 R |
| 3,765,001 | 10/1973 | Beausoleil | 340/173 R |
| 3,781,826 | 12/1973 | Beausoleil | 340/173 R |
| 3,803,560 | 4/1974 | DeVoy et al. | 364/200 |
| 3,845,476 | 10/1974 | Boehm | 340/173 BB |
| 4,028,539 | 6/1977 | Jacobs | 371/10 |
| 4,051,460 | 9/1977 | Yamada et al. | 364/900 |
| 4,093,985 | 6/1978 | Das | 364/200 |
| 4,150,428 | 4/1979 | Inrig et al. | 364/200 |
| 4,251,863 | 2/1981 | Rothenberger | 364/200 |
| 4,342,079 | 7/1982 | Stewart et al. | 364/200 |
| 4,380,066 | 4/1983 | Spencer et al. | 371/10 |
| 4,450,559 | 5/1984 | Bond et al. | 371/10 |
| 4,456,966 | 6/1984 | Bringol et al. | 364/900 |
| 4,475,176 | 10/1984 | Ishii | 364/900 |
| 4,527,251 | 7/1985 | Nibby, Jr. et al. | 364/900 |

FOREIGN PATENT DOCUMENTS 3520893 12/1985 Fed. Rep. of Germany .

OTHER PUBLICATIONS

L. R. Palounek, "Memory Allocation and Addressing," IBM Tech. Disclosure Bulletin, vol. 11, No. 1, 6/68, pp. 67–70.

R. N. Ames et al., "Implementation of Reserve Storage for Bit/Word Hard Failures in Main Memory Without Software Support", IBM Tech. Disclosure Bulletin, vol. 26, No. 4, 9/83, pp. 1843–1845.

Primary Examiner—Gary V. Harkcom
Assistant Examiner—Michael A. Jaffe
Attorney, Agent, or Firm—W. E. Zitelli; M. J. McKinley

[57] ABSTRACT

A microcomputer system has a first, low order address, memory soldered to the planar printed circuit board and can accept further memory pluggable into a socket on the board. At power on self test, the memories are tested, and, if an error is detected in the first memory, this memory is disabled by directing the lowest order memory addresses to the second memory and reducing the highest order addresses by the number of locations in the first memory.

5 Claims, 3 Drawing Sheets

MEMORY RE-MAPPING IN A MICROCOMPUTER SYSTEM

This is a continuation application of parent application Ser. No. 029,013 filed Mar. 23, 1987, now abandoned.

TECHNICAL FIELD

The present invention relates to memory addressing arrangements in microcomputer systems, and in particular to memory re-mapping circuits.

BACKGROUND TO THE INVENTION

Many arrangements have been suggested to minimize the effect of faulty memory elements within a computer system. In some systems, spare memory modules are switched in to replace modules containing faulty elements, in others this replacement is performed at byte, word, row or column level, and in others error correction techniques are employed.

An example of the first of these systems is shown in U.S. Pat. No. 4,150,528 (Inrig and Chapman). In that system a memory module is marked as a substitute module which, on detection of a fault in any other module, responds to addresses ordinarily directed to the faulty module. An example of a system which operates at a less than full module level is shown in U.S. Pat. No. 4,527,251 (Nibby, Goldin and Andrews). In that system, a static memory stores a map showing the faulty areas of a random access memory, this map being generated in response to memory testing. In operation, the map is employed to avoid faulty areas in the random access memory. Error correction systems for correcting data read from faulty memory locations are shown in U.S. Pat. Nos. 3,436,734 (Pomerene and Melville) and 4,251,863 (Rothenberger).

None of these prior art systems includes an arrangement in which, if a fault is detected in a memory block defined by the lowest value addresses, that block is disabled and these addresses are employed to access the memory block previously defined by the set of addresses immediately above the lowest value addresses. Thus, the total memory is reduced by the memory in the disabled memory block.

This arrangement is highly advantageous in a system in which the lowest order memory block is soldered or otherwise fixedly attached to the planar circuit board of the microcomputer in order to minimize basic cost. These low order memory locations are used to store control program data and without them the system can not work. On the other hand this soldered memory is not normally replaceable, the usual service being to replace the complete planar circuit board on detection of a fault therein. Accordingly, by remapping the low order locations to pluggable memory, the system can still operate without planar board replacement.

DISCLOSURE OF THE INVENTION

In accordance with the invention, a memory remapping system is provided for a microcomputer. The microcomputer includes a processor planar board, first memory means permanently attached to and connected to circuitry on the planar board, connector means on the planar board for removably coupling second memory means thereto, and address means coupled to said first memory means and to said connector means for addressing memory installed in the system. The address means includes logic means for selecting blocks of said installed memory, and there is provided means for testing at least said first memory means and means for recording a detected fault in said first memory means. Said logic means is coupled to said means for recording for directing all memory addresses to said connector means in response to a fault record in said means for recording.

DETAILED DESCRIPTION

Figure 1:
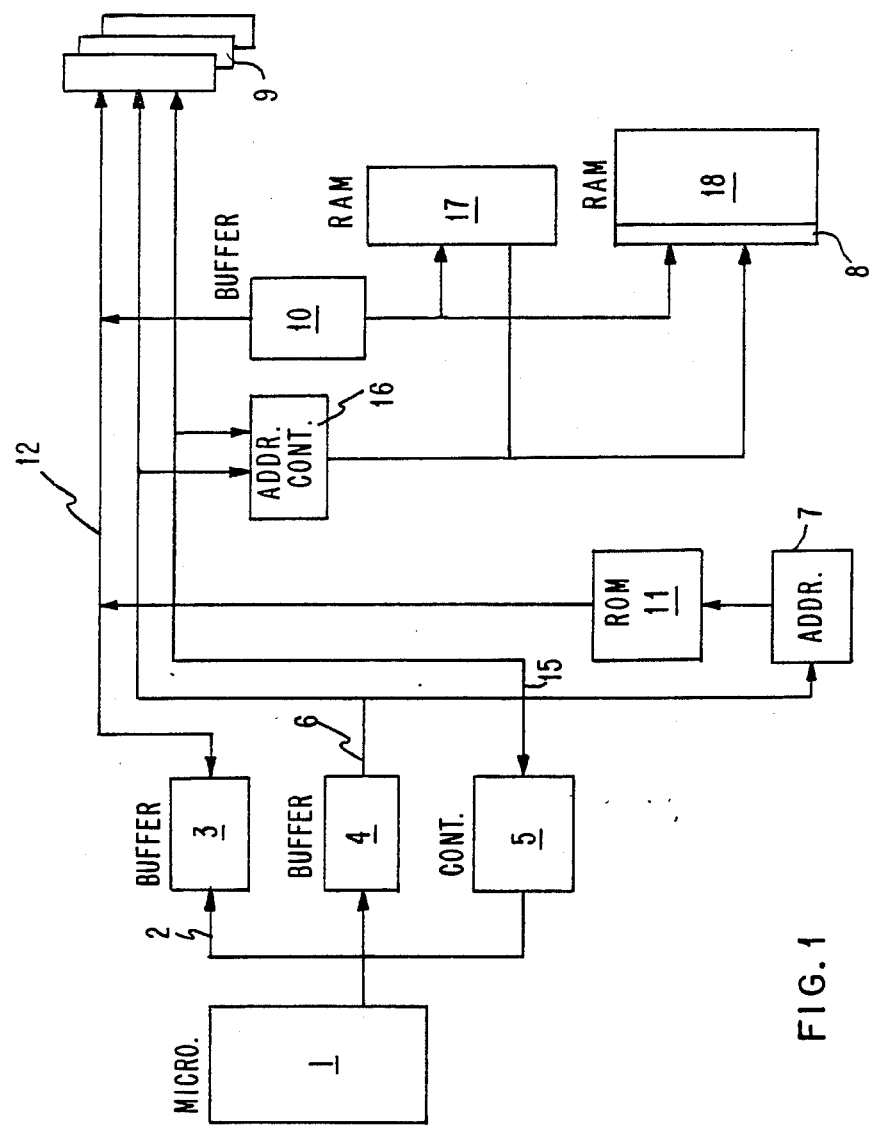
FIG. 1 is a general block diagram of a microcomputer system.

FIG. 1 is a block diagram showing major components of a microcomputer system. The system comprises a microprocessor 1 coupled by a bus 2 to an address buffer 4, a data buffer 3 and a bus controller 5. Address buffer 4 is coupled through an address bus 6 to a read-only memory address system 7, a main memory address and control system 16 and system expansion connectors 9. Data buffer 3 is coupled, through a data bus 12, to a memory data buffer 10, the data output of a read-only memory 11, and connectors 9. Bus controller 5 is coupled through a control bus 15 to the address and control system 16 and the connectors 9. Memory address and control system 16, and data buffer 10 are coupled to two random access memory systems 17 and 18. Memory system 17 is permanently attached to the planar circuit board supporting and coupling all the FIG. 1 components by, for example, soldering its leads to the printed circuit wiring on the board. Memory system 18 is a replaceable memory which is pluggable into socket means 8 which is itself permanently attached, by soldering to the planar circuit board leads. The reason for this arrangement is that the microcomputer requires a minimum amount of memory which, for low cost, is soldered directly to the board. Extra memory, if required, can be added to the system by plugging further memory modules into socket means 8. As an example, memory system 17 may comprise 128K bytes, and the memory system 18 modules may comprise up to 512K bytes to make a total of 640K bytes.

Figure 2:
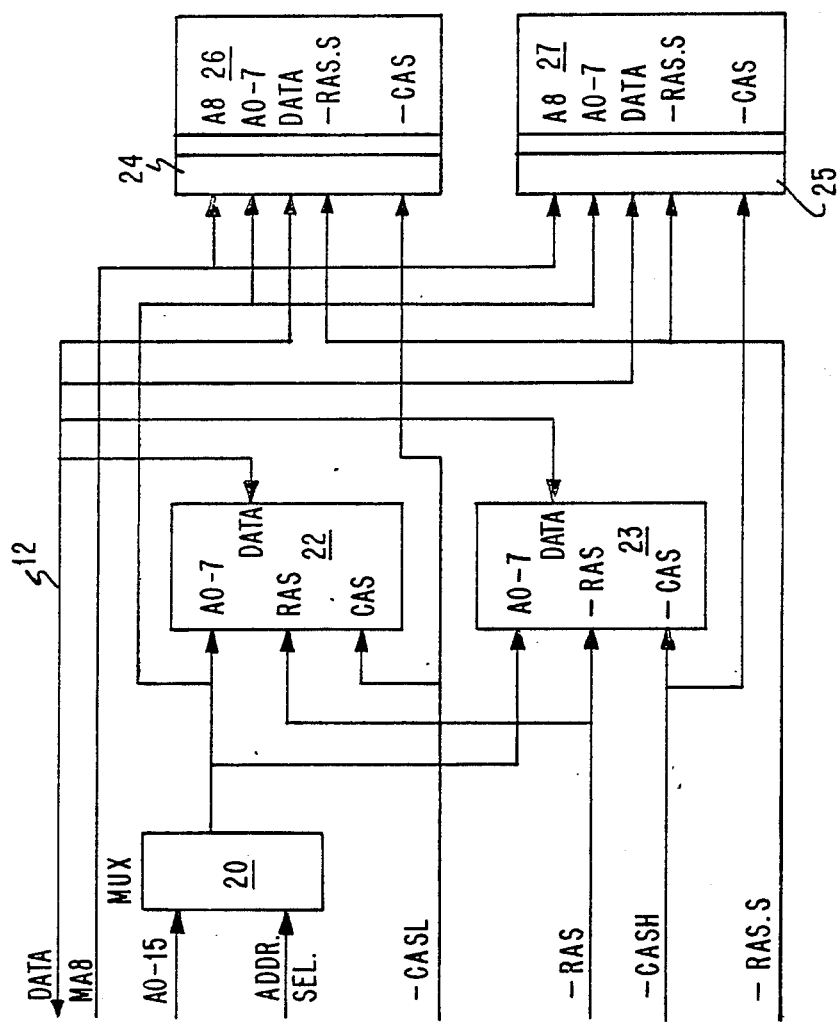
FIG. 2 shows details of the connections to memories of FIG. 1.

FIG. 2 shows some details of the addressing and control arrangement 16 for the memories. Address multiplexer 20 receives sixteen lines of the address bus corresponding to address bits A0 through A15, and, in accordance with the value of an address select signal on line 21, passes either bits A0 through A7 or A8 through A15 to memories 22 and 23 (shown generally as memory system 17 in FIG. 1) and sockets 24 and 25 (shown generally as socket means 8). As is well known, in dynamic random access memory systems, addressing is accomplished by applying a first set of address bits together with a negative-going row address strobe (—RAS) signal followed by a second set of address bits with a negative—going column address strobe (—CAS) signal. These —CAS and —RAS signals are generated by control unit 16, FIG. 1. Multiplexer 20 is switched between first and second states with the —RAS and —CAS signals to apply the A0–A7 as row address and A8–A15 as column address signals respectively to the memory A0–A7 address inputs. Memories 22 and 23 are 64K organization DRAMs, and, therefore, require 8×2 bit address inputs. Their data input/output terminals are each applied to a data bus 12. Both memories 22 and 23 receive a common —RAS signal, and memory 22 is selected by a —CASL signal while memory 23 is selected by a —CASH signal. The manner of generating these different —CAS signals to select the different memories is well known and will not be described further.

Sockets 24 and 25 are arranged to accept pluggable 256K byte DRAMs 26 and 27 respectively. As with the memories 22 and 23, these memories are addressed by address bits A0 through A15 and controlled by the —CASL and —CASH signals. Their data lines are coupled to data bus 12. They differ from memories 22 and 23 firstly in that, as they have a greater capacity, they require a further address input MA8 and they receive a different row address strobe, —RAS.S. The development of the —RAS and —RAS.S signals will be described in detail later.

In general, the memories are addressed by a total of 20 bits from, for example, CPU 1. The first sixteen of these bits provide the individual addresses for memory 22 with no higher bit values, and cause the selection of —RAS and —CASL to select this memory. Memory 23 is selected when —CASH is active with A16 high. In response to the next three higher bits A17 through A19, memories 26 and 27 are selected.

Figure 3:
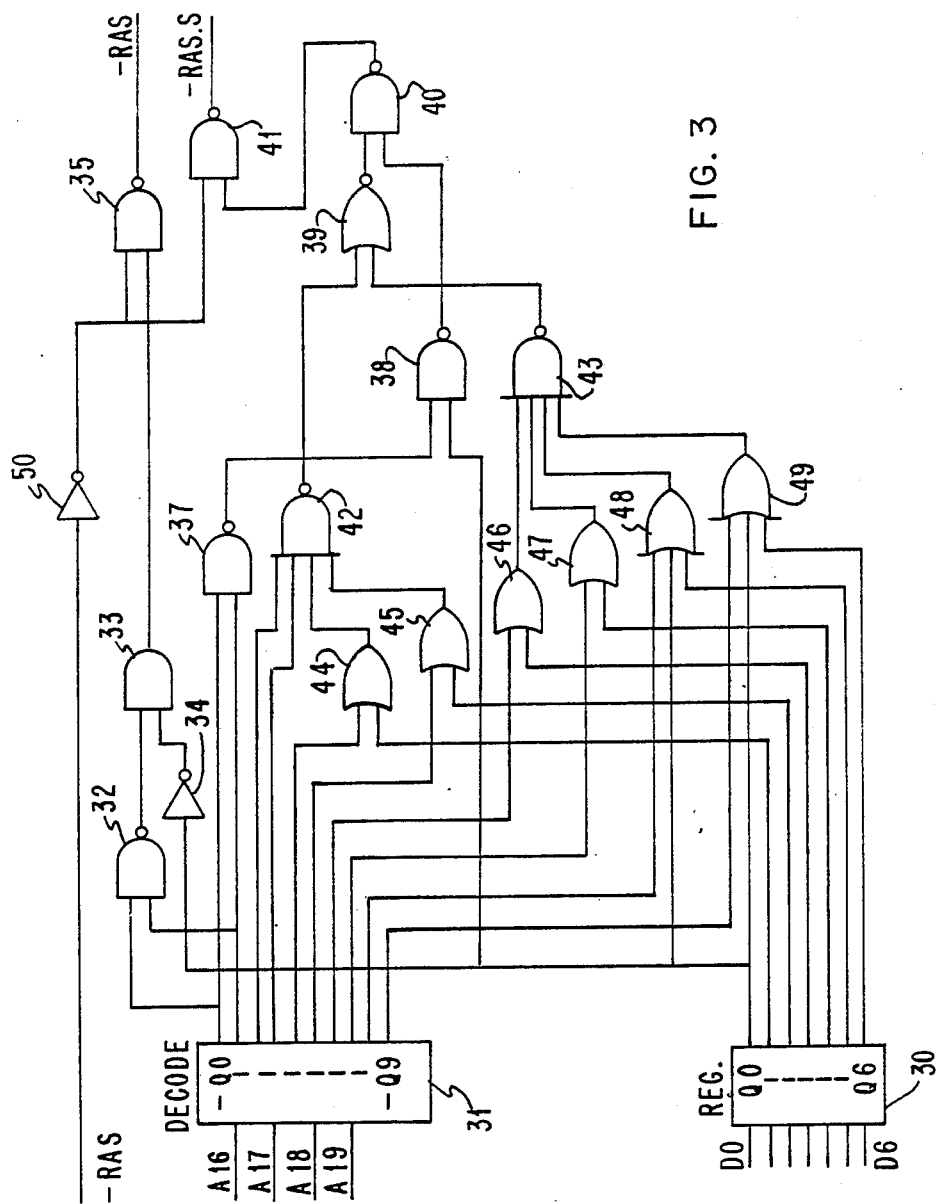
FIG. 3 is a logic diagram of a memory remapping controller.

For convenience, the description of the FIG. 3 system will reference memories 22 and 23 as the soldered memories, and memories 26 and 27 as the socket memories.

FIG. 3 is a logic diagram of a portion of address control unit 16, FIG. 1. This circuit incorporates a register 30 which is new to microcomputer architecture. This register is CPU addressable and is employed to record the results of memory and I/O tests during microcomputer power on self-test (POST) operations. These POST operations are described, for example, in the system BIOS section of the Technical Reference Manual, Personal Computer, Form No. 6361453, produced by International Business Machines Corporation. The POST operations are, of course, controlled by the system ROM 11 (FIG. 1). The above Technical Reference Manual shows, at page 5-33, the read-write storage test for any 16K byte block of memory. Briefly, this comprises writing, and then reading the pattern 01010101 and then the pattern 10101010 into each memory location in the block and, by parity checking, determining any errors. Pages 5-37 and 5-42 of the manual show the routines for determining the RAM size on the planar board, and the memory size on the I/O channels. Again, these operations include write/read sequences which, by reading data previously attempted to write in sequential locations, determine whether or not these locations are, in fact, present. Page 5-36 shows a read-/write storage test on the base (lowest ordered address) memory. In that example, the test is on 16K bytes. In the present system, a similar test would be made on the 128K bytes of the soldered memory, i.e. memories 22 and 23 in FIG. 2. Finally, at page 5-43, there is shown a routine for recording a failing address in memory on detection of an error. These routines, and other similar self test routines for checking the size of memory and any errors therein are well known and employed in most microcomputer systems.

In the present system, the results of some of the tests are recorded in an addressable register 30, FIG. 3. This register records, at input D0, to give a high output at Q0, an error located in the soldered memory modules 22 and 23 (FIG. 2). Note that this register remains set after a POST until it is specifically reset or until the system is reset or switched off, both of which conditions require a further POST before operations are continued. The remaining register 30 locations contain data resulting from the I/O memory size tests. Each of these locations, driven through inputs D1 through D6 to provide respective high levels on outputs Q1 through Q6, relates to an associated 64K byte block of I/O memory. These 64K byte blocks relate to system addresses as follows: Q1 equals addresses 256K-320K, Q2 equals addresses 320K-384K, Q3 equals addresses 384K-448K, Q4 equals addresses 448K-512K, Q5 equals addresses 513K-576K and Q6 equals addresses 576-640K. Thus, at the end of a POST, register 30 contains an indication of a located error in the base memory and indications of the number of 64K byte segments of memory on I/O cards.

Referring back to FIG. 3, decoder 31 is a four-to-sixteen line decoder receiving system address bits A16-A19, the outputs of which are limited in the diagram to ten inverted outputs —Q0 through —Q9 for simplicity. Note that address bits A0 through A16 are the only address bits required to address memory modules 22 and 23 in FIG. 1. Address bits A17, A18 and A19 are additionally used to define locations in the socketed RAMS, i.e., those addresses above 128K, i.e., in the FIG. 2 system, addresses between 128K and 640K. With address bits A19-A16 regarded as four digit memory numbers, each binary increment represents 64K of memory. Decoder 31 functions are defined as follows:

| A19 | A18 | A17 | A16 | —Q0 | —Q1 | —Q2 | —Q3 | —Q4 | —Q5 | —Q6 | —Q7 | —Q8 | —Q9 |
|---|---|---|---|---|---|---|---|---|---|---|---|---|---|
| 0 | 0 | 0 | 0 | 0 | 1 | 1 | 1 | 1 | 1 | 1 | 1 | 1 | 1 |
| 0 | 0 | 0 | 1 | 1 | 0 | 1 | 1 | 1 | 1 | 1 | 1 | 1 | 1 |
| 0 | 0 | 1 | 0 | 1 | 1 | 0 | 1 | 1 | 1 | 1 | 1 | 1 | 1 |
| 0 | 0 | 1 | 1 | 1 | 1 | 1 | 0 | 1 | 1 | 1 | 1 | 1 | 1 |
| 0 | 1 | 0 | 0 | 1 | 1 | 1 | 1 | 0 | 1 | 1 | 1 | 1 | 1 |
| 0 | 1 | 0 | 1 | 1 | 1 | 1 | 1 | 1 | 0 | 1 | 1 | 1 | 1 |
| 0 | 1 | 1 | 0 | 1 | 1 | 1 | 1 | 1 | 1 | 0 | 1 | 1 | 1 |
| 0 | 1 | 1 | 1 | 1 | 1 | 1 | 1 | 1 | 1 | 1 | 0 | 1 | 1 |
| 1 | 0 | 0 | 0 | 1 | 1 | 1 | 1 | 1 | 1 | 1 | 1 | 0 | 1 |
| 1 | 0 | 0 | 1 | 1 | 1 | 1 | 1 | 1 | 1 | 1 | 1 | 1 | 0 |

From this, it can be seen that for addresses up to 128K, that is, the addresses which correspond, under normal conditions, to the soldered memory, either —Q0 or —Q1 are active (zero) and the remaining outputs are passive (high). Thereafter, each increment, i.e. low output in an adjacent —Q output, represents the addresses of an adjacent 64K byte block of the socket memories.

A NAND gate 32 has a pair of inputs coupled respectively to the —Q0 and —Q1 outputs of decoder 31. The output of NAND gate 32 is applied as one input to an AND gate 33 which receives, at its other input the Q0 output of register 30 inverted by inverter 34. The output of NAND gate 33 provides one input to a NAND gate 35 which also receives the system row address strobe signal —RAS (active low.).

A further NAND gate 37 is also coupled to the —Q0 and —Q1 outputs of decoder 31, and this NAND gate has its output coupled to one input of another NAND gate 38. The Q0 output of register 30 provides the other input to NAND gate 38, whose output forms one input to a NAND gate 40. NAND gate 40 also receives the output of a NOR gate 39. The first input to NOR 39 is from a NAND gate 42 coupled to receive the —Q2 and —Q3 outputs of decoder 31 directly and outputs —Q4 and —Q5 of this decoder through OR gates 44 and 45 respectively. These OR gates also respectively receive the Q1 and Q2 outputs of register 30. The second input to NOR gate 39 comes from a NAND gate 43 which receives outputs —Q6 through —Q9 of decoder 31 through respective OR gates 46 through 49. These OR gates also respectively receive outputs Q3 through Q6 of register 30 as shown. OR gates 48 and 49 each have a third input coupled to the Q0 output of register 30.

The operation of the FIG. 3 system will first be described for the condition in which all of the outputs Q0–Q6 of register 30 are in the logic zero binary state which means that no fault was detected during power on self test and no I/O card memory was detected at that time.

For each address of the low 128K bytes of memory, i.e., the soldered memory, either address bits A16 through A19 are all zero or A16 only of these bits is a one. As can be seen from the above (see page 9( table of the decoder 31, in these cases either output —Q0 or output —Q1 is zero with the remaining outputs of the decoder high. Accordingly, the output of gate 32 goes high and with a high input to gate 33 from inverter 34 (as Q0 of register 30 is low), the output of gate 33 is high. With the input to gate 35 from gate 33 high, the output of gate 35 is the inverse of the output of inverter 50. Thus, the output of gate 35 follows the —RAS signal applied to inverter 50. This output signal is, as has been described with reference to FIG. 1, the signal which selects the lower 128K soldered memory elements. At the same time, the output of gate 37 to gate 38 is high, but the low input to gate 38 from output Q0 of register 30 maintains the output of gate 38 high. As all the inputs to gates 42 and 43 are high, the outputs of both of these gates are low so that gate 39 supplies a high output to gate 40. As both inputs to gate 40 are high, it provides a low output to gate 41 whose output, therefore, remains high irrespective of the level of the input inverted —RAS signal. Thus there is no —RAS.S signal, and the socket RAM is not selected.

Next, the operation when an address in the socket memory is selected, again with all of the outputs Q0–Q6 of register 30 at binary zero, will be considered. In this case decoder outputs —Q0 and —Q1 both remain high, and one of the outputs —Q2 through —Q9 is low as at least one of address bits A17 through A19 will be high. As both inputs to gate 32 are now high, this gate applies a low input to gate 33 which therefore applies a low input to gate 35. The —RAS output line therefore remains high irrespective of the inputs to gate 35 from inverter 50, so no —RAS signal is generated and the soldered memory is, therefore, not selected. In response to the —Q0 and —Q1 decoder 31 outputs, the output of gate 37 goes low so that the gate 38 output goes high. Now one of the outputs —Q2 through —Q9 of the decoder 31 is low, so that the output of either gate 42 or gate 43 goes high. Thus the output of gate 39 goes low, so the output of gate 40 goes high despite the high input to this gate from gate 38. With the high input from gate 40, the output of the —RAS.S line is the inverse of the output of inverter 50, so the socket memory is selected by the —RAS.S signal.

For the next examples, let us assume that a power on self test sequence has detected an error in the lowest 128K memory elements, and in response to this detection, a one bit has been entered into input D0 of register 30, so that the Q0 output is switched to high.

The first effect of the high level on the Q0 output of register 30 is that the output of inverter 34 goes low, so gate 33 output is always low. Accordingly the output of gate 35 is always high, so then no —RAS signal is produced. This means that the soldered 128K byte memory is not accessed, which is what is required when a fault had been detected in it.

We now wish to use the lowest 128K addresses to access the socket memory modules. These addresses, in which A16 is either one or zero and A17 through A19 are all zero, produce a low output on either the —Q0 or the —Q1 outputs of decoder 31. These outputs cause the output of gate 37 to go high. This output, together with the high output from output Q0 of register 30, causes the output of gate 38 to go low. With the output of gate 38 low, the output of gate 40 goes high irrespective of the value of its other input. With the high input from gate 40 to gate 41, this latter gate inverts the input from inverter 50 to provide the —RAS.S signal which follows the input —RAS signal. Thus, the lowest 128K addresses now access the socket, rather than the soldered, memory. As indicated above, each —Q output of decoder 31 represents a 64K byte block of storage. Thus, when —Q0 is low, the lowest 64K bytes are accessed, —Q1 is low when addresses 64K–128K are used, —Q2 when addresses 128K–192K are generated, and so on, with —Q8 being low for addresses 512K to 576K and —Q9 low for addresses 576K to 640K. With the Q0 high signal from register 30, the soldered memory is not accessed and only the 512K bytes of socket memory are used. The generation of the —RAS.S signal for addresses up to 128K has been described above. For each of the addresses of the next 384K of storage, that is, up to address 512K, one of outputs —Q2 through —Q7 of decoder 31 goes low. For this address range, therefore, the output of either gate 42 or gate 43 goes high. At this time, the output of gate 37 is low (as both —Q0 and —Q1 are high), so gate 38 output is high. The high outputs of either gate 42 or gate 43 passes through, and is inverted by, gate 39 to provide a low input to gate 40, so that gate continues to provide a high input to gate 41. This gate, therefore, continues to generate the —RAS.S signal for access to the socket memory. Remembering that, without the soldered memory, we only have 512K available memory addresses, we can now look at what happens if the top most 128K memory addresses, that is addresses from 512K to 640K, are generated. For each of the addresses in this range, one of decoder outputs —Q8 and —Q9 is low. These outputs normally pass through gates 48 and 49 respectively to switch gate 43 output high to provide a low input through gate 39 to gate 40. When, however, the Q0 output of register 30 is high, this level passes through both gates 48 and 49, thereby negating the low inputs from decoder outputs —Q8 and —Q9. Thus, via gates 43, 39 and 40, the lower input to gate 41 is low, so that no RAS.S signal is generated, and the memory does not respond to the highest addresses. Thus, with the Q0 output of register 30 high, the address range is limited to 512K and each address is used to access the socket memory.

It has been explained above that register 30 is used to indicate, in addition to a soldered memory error digit in position D0, indications of 64K byte memory blocks on devices coupled to I/O sockets 9 (FIG. 1). For simplicity, this memory will be termed I/O memory. The addresses of this I/O memory start at 256K and extend to 640K. This corresponds to six blocks of 64K addresses with each block, when present in the system, being indicated by a high output on a corresponding one of the Q1 through Q6 outputs of register 30. As can be seen in FIG. 3, each one of the Q1 through Q6 outputs of the register is coupled to an input of an associated one of OR gates 44 through 49. Each one, therefore, when set to a high level, negates the effect of a low output to the corresponding OR gate from decoder 31. This prevents the corresponding NAND gate 42 or 43 from delivering a high output in response to a low output from the corresponding output of the decoder. Under this condition, the output of OR gate 39 is high and, assuming the Q0 output of register 30 is low, the output of gate 38 is high. In response to the two high inputs from gates 38 and 39, the output of gate 40 is low, so that the output of gate 41 is maintained high. As we are in the situation in which addresses of values from 256K upwards are being used, gate 35 also provides a continuous high output. Thus neither the —RAS nor the —RAS.S signal is produced. In view of this, neither of the soldered or socket memory is addressed. This leaves the I/O memory for addressing. With register output Q1 high, addresses 256K-320K are in the I/O memory, with Q2 high, addresses 320K-384K are in this memory. Outputs Q3 through Q6 correspond respectively to 64K memory blocks at addresses 384K-448K, 448K 512K, 512K-576K and 576K-640K respectively. All or any one, or none, of these addresses can be transferred to I/O memory by entry of data into appropriate ones, or any one of register 30 stages D0 through D6. By resetting or over-writing any one or more of the set register stages, addressing can be switched back to the socket memory for memory blocks corresponding to the reset stages.

In summary, what has been described is an arrangement for addressing soldered memory, socket memory and I/O memory. Soldered and socket memory accesses use different negative-going row address strobes —RAS and —RAS.S respectively. A decoder decodes high order address bits and a logic circuit is responsive to the decoder outputs and a register bit indicating a fault in the soldered memory (which corresponds to low order addresses). The logic circuit switches memory addresses to the socket memory on detection of said register bit by disabling the —RAS signal and replacing it by the —RAS.S signal for the low order addresses. In addition, the register includes further stages each of which can be set to indicate a block of I/O memory. When one or more of these stages is set, the logic circuit responds by disabling both the —RAS and —RAS.S outputs so that neither the soldered nor the socket memory is accessed, but an I/O memory block is addressed instead.

While the invention has been particularly shown and described with reference to a preferred embodiment thereof, it will be understood by those skilled in the art that various changes in form and detail may be made without departing from the spirit and scope of the invention.

We claim:

1. A microcomputer circuit including first memory means, first connector means for removably coupling second memory means to said microcomputer circuit, and address and control means coupled to said first memory means and to said first connector means for addressing memory, said address and control means including: logic means for selecting the first or second memory means; and first storing means for storing an indication of a fault detected in said first memory means, said logic means being coupled to said first storing means; wherein said logic means disables said first memory means by directing all memory addresses to said first connector means in response to a fault indication stored in said first storing means;

said microcomputer circuit further comprising second connector means for removably coupling third memory means having addresses that overlap the addresses for said second memory means; said address and control means further including second storing means, coupled to said logic means, for storing the detected presence of at least one block of memory coupled to said second connector means, wherein said logic means redirects memory addresses to blocks of memory connected to said second connector means that overlap corresponding blocks of memory connected to said first connector means.

2. A microcomputer circuit according to claim 1, in which the first memory means has an address range and said logic means includes means responsive to said fault indication for disabling a highest ordered memory address range of said second memory means corresponding in size to the address range of said first memory means.

3. A microcomputer circuit according to claim 1, in which said address and control means generates first address strobe signals for said first memory means and second address strobe signals for said second memory means, and said logic means includes means for disabling said first address strobe signals from said first memory means and for enabling said second address strobe signals, to said second memory means when a fault is detected wherein said second address strobe signals are used for directing all memory addresses to said first connector means in response to said fault indication.

4. A microcomputer system according to claim 3, in which said address strobe signals are row address strobe signals.

5. A microcomputer circuit according to claim 3, in which said logic means includes:

decoder means for decoding memory addresses to generate individual output signals, each output signal corresponding to a different block of memory; and means for enabling said first address strobe signals to said first memory means in the absence of a fault indication and when said decoder means decodes an address within a block of said first memory means, and for enabling said second address strobe signals to said first connector means when said decoder means decodes an address within a block of said second memory means.

* * * * *